United States Patent [19]

Ohhinata et al.

[11] 4,288,862
[45] Sep. 8, 1981

[54] MEMORY CIRCUIT

[75] Inventors: Ichiro Ohhinata; Seiei Ohkoshi; Hideo Suzuki, all of Yokohama, Japan

[73] Assignees: Nippon Telegraph and Telephone Public Corp.; Hitachi, Ltd., both of Tokyo, Japan

[21] Appl. No.: 971,109

[22] Filed: Dec. 19, 1978

[30] Foreign Application Priority Data

Dec. 21, 1977 [JP] Japan .............................. 52-152896
Dec. 28, 1977 [JP] Japan .............................. 52-157864

[51] Int. Cl.³ ...................... G11C 11/40; G11C 15/04
[52] U.S. Cl. .............................. 365/181; 307/252 G; 307/284; 307/288; 365/180
[58] Field of Search .............. 307/238, 252 A, 252 C, 307/252 G, 284, 288, 305, 313; 365/154, 155, 156, 180, 181

[56] References Cited

U.S. PATENT DOCUMENTS

| 3,364,362 | 1/1968 | Mellott | 307/238 X |
| 3,375,502 | 3/1968 | Shively | 307/238 X |
| 3,740,730 | 6/1973 | Ho et al. | 340/173 R |
| 4,031,413 | 6/1977 | Ohhinata et al. | 307/238 |

Primary Examiner—John Zazworsky
Attorney, Agent, or Firm—Craig and Antonelli

[57] ABSTRACT

A memory circuit comprising a memory cell for storing information, constituted of semiconductor circuit elements and the associated circuit elements, and a control input section provided on the input side of the memory cell for controlling the memory cell, constituted of transistor means and current control means, wherein one of ON and OFF states is selected and also held in accordance with more than two logic input signals supplied to the control input section and no power is consumed to hold the OFF state.

11 Claims, 11 Drawing Figures

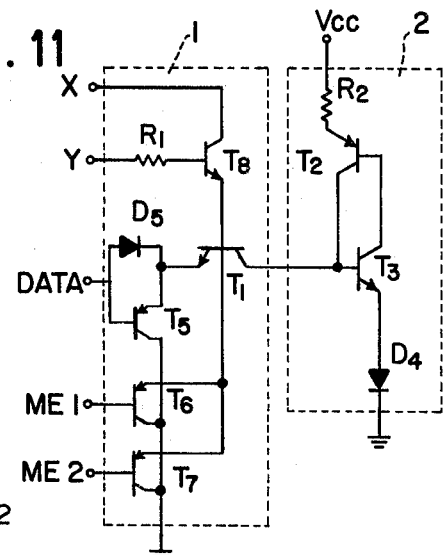
FIG. 11
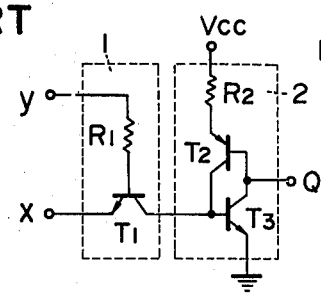
FIG. 1
PRIOR ART
FIG. 2
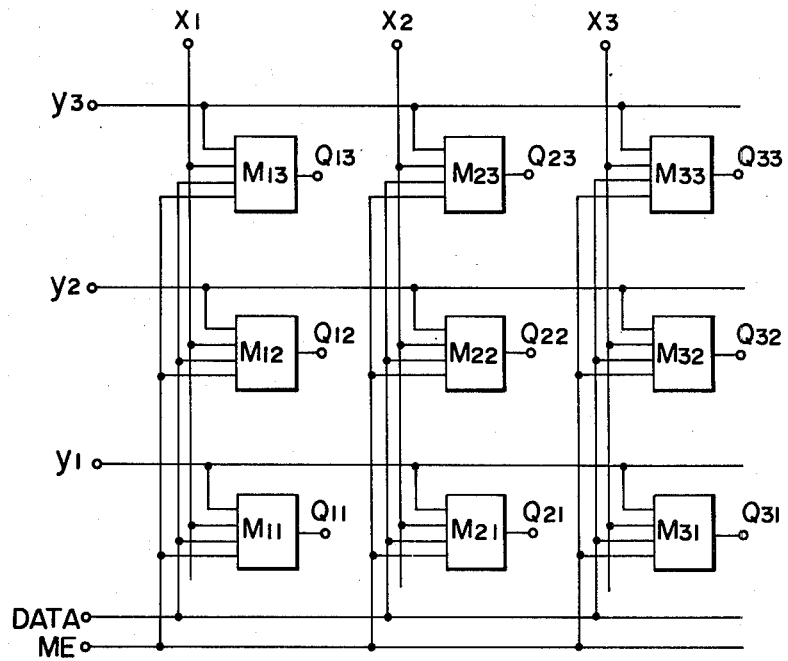

MEMORY CIRCUIT

This invention relates to a memory circuit and more particularly to a memory circuit having a control input section for controlling information content, which circuit is controlled by at least three logic inputs and needs no power to hold its OFF state.

The prior art and the embodiments of this invention will be explained below with the aid of the accompanying drawings, in which:

FIG. 1 shows a conventional memory circuit having two logic input terminals;

FIG. 2 shows a structure of a matrix constituted of memory circuit each constructed according to this invention; and FIGS. 3 to 11 respectively show memory circuits as the embodiments of this invention.

Figure 3:
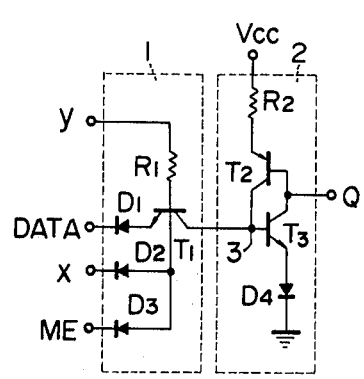

The circuit configuration of a memory circuit is usually divided at present into two types: a symmetric circuit such as a flip-flop which consumes power in either its ON or OFF state and an asymmetric circuit such as a PNPN structure having a self-holding property, which needs no power to hold its OFF state. In general, the former circuit, which is excellent in such characteristics as stability and responsiveness, will be more often used than the latter. However, the latter will also be found advantageous if it is used where power consumption should be strictly limited to a small extent. For example, the memory circuit used as the holding circuit in a speech path switch for a telephone exchange, which is most often kept at its OFF state, should be strictly required to consume a small power. FIG. 1 shows a well-known holding circuit for a speech path switch as a structure of a memory circuit used for this purpose. The function of the circuit shown in FIG. 1 is as shown in Table I given below.

TABLE I

| INPUT | | OUTPUT |
|---|---|---|
| x | y | $Q_{n+1}$ |
| 1 | 1 | ON |
| 0 | 1 | OFF |
| 1 | 0 | $Q_n$ |
| 0 | 0 | $Q_n$ |

In the above Table I, i.e. truth table, the output $Q_n$ represents the state assumed before the reception of an input and the output $Q_{n+1}$ designates the state taken after the reception of the input. This circuit shown in FIG. 1 has a great advantage that in its OFF state a control input section 1 comprising a transistor $T_1$ and a resistor $R_1$ as well as a memory cell 2 comprising transistors $T_2$ and $T_3$ and a resistor $R_2$ consumes no power. However, with this memory circuit, the memory state $Q_{n+1}$ is determined by the two inputs x and y representing the pieces of information for assigning the coordinates of the circuit. Accordingly, the circuit will be found to lack versatility where memory circuits Mij each equivalent to the circuit are arranged in the form of a matrix, as shown in FIG. 2, and the memory matrix with its increased memory capacity should be controlled by inputs received at a small number of input terminals. Namely, as seen from the truth table given above, if the input y representing a row of the memory matrix comprising the memory circuits Mij is "1", each of the memory cells associated with the row turns ON or OFF, depending on the input x representing a column of the matrix. Therefore, the memory cells belonging to the same row corresponding to an input y are simultaneously energized and the cell-by-cell control will be difficult. For example, it is inconvenient to provide an interrupt control in which after a cell belonging to a row has been energized, another cell belonging to the same row is energized. To effect such an interrupt control, it is necessary to properly select an input x in such a manner that the cell energized previously is again energized. This is a rather awkward operation.

Further, to control a memory matrix having a large capacity, constituting a plurality of unit matrices, it is necessary to provide the memory matrix with a third terminal as a selective input terminal ME (MEMORY ENABLE) for selecting each of the unit matrices.

One object of this invention is therefore to provide a memory circuit which can operate at the consumption of a small power and be independently switched on and off when incorporated and arranged in a matrix. Another object of this invention is to provide a memory circuit having an input terminal for selecting a unit matrix.

According to this invention, which has been made to attain the above objects, there is provided a memory circuit comprising a memory cell for storing information, constituted of semiconductor circuit elements and the associated circuit elements and a control input section provided on the input side of the memory cell for controlling the memory cell, constituted of a transistor means and a current control means, wherein one of ON and OFF states is selected and also held in accordance with inputs received at more than two input terminals through the current control means, characterized in that the positional information for the memory circuit is supplied to at least two input terminals while data information is supplied to the remaining one input terminal and that the data information is directly transferred to the memory cell in accordance with the positional information.

Before the explanation of preferred embodiments of this invention shown in FIGS. 3 to 10, the general view of the memory circuit which is th gist of this invention will be given. FIG. 2 provides such a general view of the present memory circuit.

In FIG. 2 (though the same description as before may be duplicated here and there, it should be permitted for the better understanding of this invention), Mij (i=1 to 3, j=1 to 3) designates memory circuits; $x_i$ and $y_j$ inputs (terminals) for selecting the row and the column as the coordinates of each memory circuit Mij; DATA a data input (terminal) as ON or OFF information to be written in the memory circuit Mij; ME an input (terminal) for switching over between the operation of writing information in a memory matrix and the operation of holding the memory matrix, or a selective input (terminal) for selecting a unit matrix when plural unit matrices are used; and Qij the output (terminal) of the memory circuit Mij.

If such a memory matrix as described above is operated as according to the truth table, i.e. Table II, given below, each of the memory circuits Mij can be independently turned on and off.

TABLE II

| INPUT | | | | OUTPUT |
|---|---|---|---|---|
| ME | x | y | DATA | $Q_{n+1}$ |
| 1 | 1 | 1 | 1 | ON |
| 1 | 1 | 1 | 0 | OFF |

TABLE II-continued

| INPUT | | | | OUTPUT |
|---|---|---|---|---|
| ME | x | y | DATA | $Q_{n+1}$ |
| 0 | φ | φ | φ | $Q_n$ |
| φ | 0 | φ | φ | $Q_n$ |
| φ | φ | 0 | φ | $Q_n$ |

φ : 1 or 0

Namely, it is clear that a memory matrix having a large capacity can be easily controlled with a small number of inputs if a unit matrix is selected by the input ME, if a memory circuit of the selected unit matrix is selected in accordance with the input pair $x_i$ and $y_p$, and if the selected memory circuit is turned on or off in accordance with the input DATA. Therefore, the memory circuit as the gist of this invention has its control input section provided with at least input terminals for such control inputs as described above.

Now, this invention will be described in detail by way of embodiments.

FIG. 3 shows a memory circuit as an embodiment of this invention, adapted for use as a component in such a memory matrix as shown in FIG. 2. In the memory circuit, the transistor means of the control input section is composed of a single transistor and the current control means comprises three diodes. Namely, the memory circuit comprises a control input seciton 1 comprising a transistor $T_1$, a resistor $R_1$ and diodes $D_1$ to $D_3$ and a memory cell 2 comprising a PNPN switch (transistors $T_2$ and $T_3$), a resistor $R_2$ and a level shift diode $D_4$. The output terminal of the memory cell 2 is indicated at reference symbol Q. The function, i.e. operation, of this memory circuit is as shown in the truth table, i.e. Table II, given above. When all the inputs ME, x and y are "1", current flows into the base of the transistor $T_1$ through the resistor $R_1$ so that the memory cell 2 is ready for the writing of information therein.

If in this case the input DATA is also "1", the base current of the transistor $T_1$ flows into the P base 3 of the memory cell via the collector of the transistor $T_1$ so that the memory cell 2 is turned on. Here, the P base 3 refers to the base of the transistor $T_3$ serving as a component of the PNPN switch and therefore the gate terminal of the PNPN switch. On the other hand, if the input DATA is "0", the transistor $T_1$ performs the forward operation. Accordingly, current flows toward the input terminal DATA, the current being drawn out of the P base 3 of the memory cell 2, so that the memory cell 2 is turned off. However, if any one of the inputs ME, x and y is "0", no base current is supplied to the transistor $T_1$, irrespective of the input DATA. Any information is therefore prevented from being written in the memory cell 2 so that the previous state continues to be held. Especially, if the input y is "0", the control input section 1 consumes no power and the memory cell 2 holding its OFF state consumes no power, either. Thus, a memory circuit which can be operated by a small power, can be realized.

It is apparent that the three inputs ME, x and y can be arbitrarily selected, but if the circuit is so designed that the inputs supplied to the base of the transistor $T_1$ may most often take the level "0", an advantage of low power consumption can be enjoyed.

With the circuit configuration described above, since the memory cell 2 is turned off by drawing out the base current of the transistor $T_3$ through the series circuit of the diode $D_1$ and the transistor $T_1$, it is preferable that the forward voltage drop across the diode $D_1$ and the collector-emitter saturation voltage of the transistor $T_1$ should be as low as possible. So, a Schottky barrier diode may be effectively used as the diode $D_1$ and if the diodes $D_2$ and $D_3$ are also Schottky barrier diodes, the resultant memory circuit becomes advantageous in view of the noise margin in the non-selected state (margin for preventing an erroneous operation due to noise in the non-selected state). Also, to increase the noise margin, the input y may be supplied to the base of the transistor $T_1$ through the series circuit of a resistor and a level shifting diode.

Figure 4:
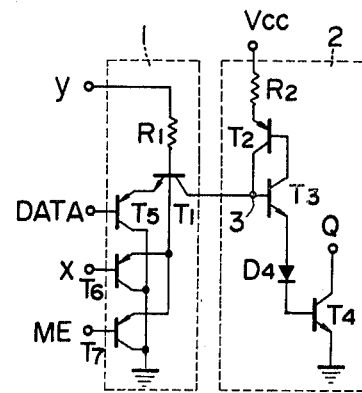

FIG. 4 shows a memory circuit as a second embodiment of this invention, in which the diodes $D_1$ to $D_3$ used in the circuit shown in FIG. 3 are replaced by PNP transistors $T_5$ to $T_7$. This memory circuit also performs such an operation as according to the truth table, i.e. Table II, given above. This circuit has an advantage that if the input y is "1" while the inputs DATA, x and ME are "0", only a small current flows out toward the input terminals DATA, x and ME. For the flowing-out of the currents toward the input terminals will be decreased with the increase in the current amplification factors of the PNP transistors since the currents flowing in through the input terminal y flows out as the base currents to the PNP transistors $T_5$ to $T_7$. In this case, too, as described with the previous embodiment, the control input section 1 consumes no power when the input y is "0". To make the turn-off operation of the memory cell 2 exact, it is only necessary to make such a level shift that the potential at the P base 3 of the PNPN switch (comprising the transistors $T_2$ and $T_3$) in the conducting state is elevated. This is effected by the provision of the combination of a diode $D_4$ and a transistor $T_4$, as shown in FIG. 4.

Figure 5:
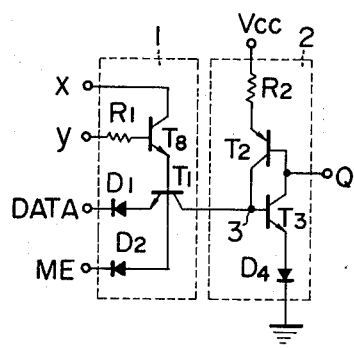

FIG. 5 shows a memory circuit as a third embodiment of this invention, in which the transistor means of the control input section comprises two transistors and the current control means is formed of two diodes. Namely, this circuit will be equivalent to the circuit shown in FIG. 3 when a second transistor $T_8$ is added to the control input section 1. The addition of the second transistor $T_8$ to the control input section 1 causes the increase in the base current to the first transistor so that the switching operation of the first transistor is made faster. In FIG. 5, a memory circuit comprises the control input section 1 comprising a resistor $R_1$, transistors $T_1$ and $T_8$, and diodes $D_1$ and $D_2$ and a memory cell 2 with an output terminal Q, comprising a PNPN switch (transistors $T_2$ and $T_3$), a resistor $R_2$ and a level shifting diode $D_4$. The operation of this memory circuit is also as shown in the truth table, i.e. Table II, given above. Namely, when all the inputs ME, x and y are "1", current is supplied to the base of the transistor $T_1$ through the transistor $T_8$ so that information can be written in the memory cell. If in this case the input DATA is "1", the base current of the transistor $T_1$ flows into the P base 3 of the memory cell 2 via the collector of the transistor $T_1$ so that the memory cell 2 is turned on. The term "P base" refers again to the base of the transistor $T_3$ as a component of the PNPN switch and therefore is the gate terminal of the PNPN switch. If, on the other hand, the input DATA is "0", the transistor $T_1$ operates forward and current is drawn out of the P base 3 of the memory cell 2 toward the input terminal DATA so that the memory cell 2 is turned off. If, however, any one of the inputs ME, x and y is "0", no base current is supplied to the transistor $T_1$, irrespective of the input DATA. Any information is therefore prevented from being written in the memory cell 2 so that the previous state continues to be held. Especially, if the input y is "0", the control input section 1 consumes no power and the memory cell 2 holding its OFF state consumes no power, either. Thus, a memory circuit which can be operated by a small power, can be obtained. It is apparent that the three inputs ME, x and y can be arbitrarily selected, but if the circuit is so designed that the inputs supplied to the base of the transistor $T_1$ may most often take the level "0", an advantage of low power consumption can be enjoyed. With this circuit configuration, since the memory cell 2 is more rapidly turned off by drawing out the base current of the transistor $T_3$ as a component of the PNPN switch through the series circuit of the diode $D_1$ and the transistor $T_1$, it is preferable that the forward voltage drop across the diode $D_1$ and the collector-emitter saturation voltage of the transistor $T_1$ should be as low as possible. For this reason, a Schottky barrier diode may be effectively used as the diode $D_1$ and if the diode $D_2$ is also a Schottky barrier diode, the resultant memory circuit is advantageous in view of the noise margin in the non-selected state (margin for preventing an erroneous operation due to noise in the nonselected state).

Figure 6:
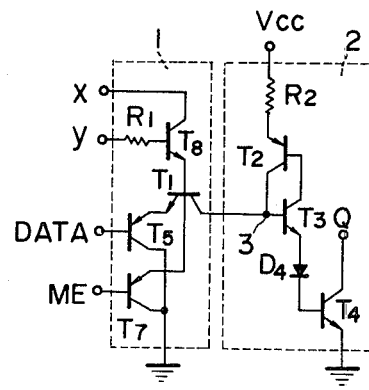

FIG. 6 shows a memory circuit as a fourth embodiment of this invention, in which the diodes $D_1$ and $D_2$ used in the circuit shown in FIG. 5 are replaced by PNP transistors $T_5$ and $T_7$. This memory circuit also performs such an operation as according to the truth table, i.e. Table II, given above. This circuit has an advantage that if the inputs x and y are 371" while the inputs DATA and ME are "0", only a small current flows out toward the input terminals DATA and ME. For the flowing-out of the currents toward the input terminals will be decreased with the increase in the current amplification factors of the PNP transistors since the currents flowing in through the input terminals x and y flow out as the base currents to the PNP transistors $T_5$ and $T_7$. In this case, too, as described with the previous embodiment shown in FIG. 5, the control input section 1 consumes no power when the input y is "0". To make the turn-off operation of the memory cell 2 accurate, it is only necesssary to make such a level shift that the potential at the P base 3 of the PNPN switch (transistors $T_2$ and $T_3$) in the conducting state is raised. This is effected by the provision of the combinaton of a diode $D_4$ and a transistor $T_4$, as shown in FIG. 6.

Figure 7:
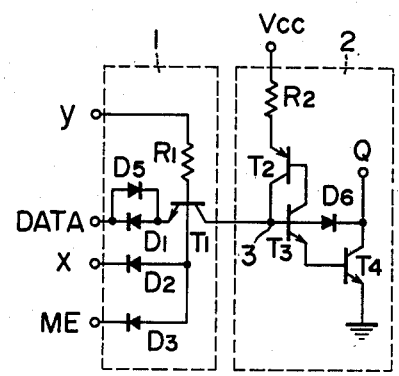

FIG. 7 shows a memory circuit as a fifth embodiment of this invention, which can perform the writing operation faster. In FIG. 7, the transistor means of the control input section 1 is a single transistor and the current control means of the section 1 comprises four diodes. In this embodiment, a diode $D_5$ is connected in inverse parallel configuration with the diode $D_1$ connected with the input terminal DATA so as to make the writing operation faster. This configuration allows the transistor $T_1$ to perform an inverse transistor action when the writing operation is carried out in response to the level "1" of the input DATA. Accordingly, the current from the input terminal DATA as well as the input terminal y flows in the memory cell 2 through the diode $D_5$ and therefore the turn-on operation will be made faster. The turn-off operation can also be made faster by replacing the level shifting diode $D_4$ forming a part of the memory cell 2 by a transistor $T_4$ and also by inserting a diode $D_6$, as shown in FIG. 7, so that the transistor $T_4$ may be prevented from being saturated. The fast memory cell as described above, using the transistor $T_4$ and the diode $D_6$ is disclosed in the specification of U.S. Pat. No. 4,031,412 filed by the present Applicant. The operation of the memory circuit shown in FIG. 7 is the same as that of the memory circuit shown in FIG. 3 and obeys the truth table given as Table II above. The output Q may be derived directly from the transistors $T_2$ and $T_3$ as shown in FIG. 3 or from the transistor $T_4$ as shown in FIG. 7.

Figure 8:
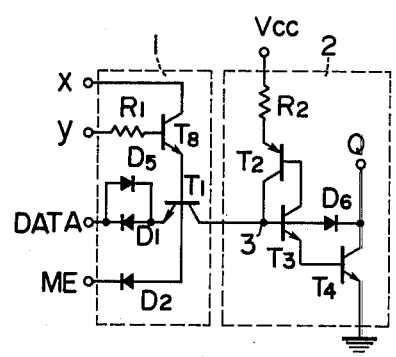

FIG. 8 shows a memory circuit as a sixth embodiment of this invention, which can perform the writing operation at still higher speed by the provision of a second transistor $T_8$ in the control input section of the memory circuit shown in FIG. 7. In the memory circuit shown in FIG. 8, the transistor means of the control input section comprises two transistors and the current control means is constituted of three diodes. In this embodiment, as in the circuit shown in FIG. 7, a diode $D_5$ is connected in inverse parallel configuration with the diode $D_1$ connected with the input terminal DATA so as to make the ON writing operation faster. This configuration allows the transistor $T_1$ to perform an inverse transistor action when the ON writing operation takes place in response to the level "1" of the input DATA. Accordingly, the current from the input terminal DATA as well as the transistor $T_8$ flows into the P base 3 of the memory cell 2 so that the turn-on operation can be made faster. The OFF writing operation can also be made faster by replacing the level shifting diode $D_4$ forming a part of the memory cell 2 shown in FIG. 5 by a transistor $T_4$ and also providing a diode $D_6$ as shown in FIG. 8, so that the transistors $T_2$, $T_3$ and $T_4$ may be prevented from being saturated. The operation of the memory circuit shown in FIG. 8 is the same as that of the memory circuit shown in FIG. 5 and follows the truth table given as Table II above. The output Q may be derived directly from the transistors $T_2$ and $T_3$ as shown in FIG. 5 or from the transistor $T_4$ as shown in FIG. 8.

Figure 9:
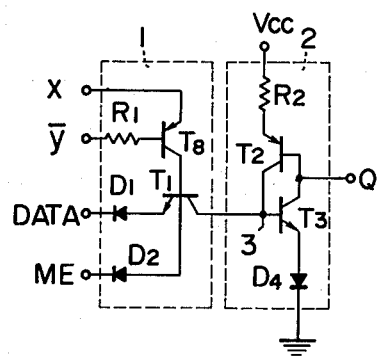

In the above embodiments shown in FIGS. 5, 6 and 8, the second transistor $T_8$ is of NPN type but it can be, of course, of PNP type as shown in FIG. 9. In case of the embodiment shown in FIG. 9, since the memory circuit is selected when the input y to be supplied to the base of the transistor $T_8$ is "0", and not selected when the input y is "1", the operation of the circuit follows the truth table given as Table II above if the value of y is inverted. Namely, this is the inverse logic condition with respect to y and the following truth table given as Table III will hold, adopting the inverted version $\bar{y}$ of the input y.

TABLE III

| INPUT | | | | OUTPUT |
| --- | --- | --- | --- | --- |
| ME | x | y | DATA | $Q_{n+1}$ |
| 1 | 1 | 0 | 1 | ON |
| 1 | 1 | 0 | 0 | OFF |
| 0 | φ | φ | φ | $Q_n$ |
| φ | 0 | φ | φ | $Q_n$ |
| φ | φ | 1 | φ | $Q_n$ |

φ : 1 or 0

Figure 10:
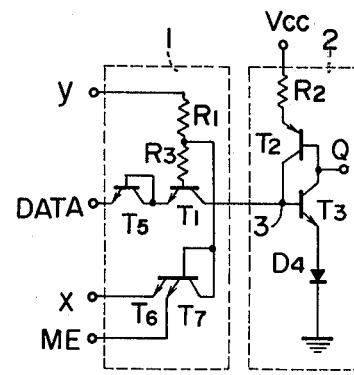

FIG. 10 shows a memory circuit as an eighth embodiment of this invention. In FIG. 10, the transistor mean of the control input section 1 is a single transistor and the current control means of the section 1 comprises three transistors. To increase the noise margin in the non-selected state, i.e. when the inputs x and ME are both "0", a series circuit of impedance elements $R_1$ and $R_3$ is connected between the input terminal y and the transistor $T_1$ and transistors $T_6$ and $T_7$ are connected with the junction point of the impedance elements.

FIG. 11 shows a memory circuit as a ninth embodiment of this invention. In FIG. 11, the emitter-base junctons of PNP transistors ($T_5$, $T_6$, $T_7$) with their collectors connected in common and grounded are used as further input terminals (DATA, ME1, ME2) of the memory circuit.

The memory matrix shown in FIG. 2 is thus constructed by the memory circuits each of which is equivalent to that described above as one of the embodiments of this invention, with the input terminals ME, x and y arbitrarily connected but with the input terminals DATA's of the respective memory circuits connected together to form a common terminal. If in this case the emitters of the transistors $T_1$ in the whole matrices are connected together and one matrix comprises each one of the diodes $D_1$ and $D_5$ or the transistor $T_5$, the construction elements can be cut down and the input capacitance of the input terminals DATA's can be minimized.

If the diodes $D_2$ and $D_3$ or the transistors $T_6$ and $T_7$ are shunted respectively by diodes or transistors so as to form a second and a third input terminals ME's, the capacity of the matrix can be easily increased.

As described above, according to this invention, the input section for controlling the memory cell is constituted of the transistor means and the current control means comprising plural diodes. The memory cell is turned on and off by using the forward and inverse operation of the transistor while the held state is formed by cutting the transistor off. Further, input terminals for input data are prepared by connecting diodes or the like elements with the emitter of the transistor while the input terminal for selecting the memory cell is prepared by connecting a diode or the like element in parallel with the base of the transistor.

Therefore, according to this invention, each of the memory circuits constituting the memory matrix can be independently turned on and off and moreover the memory matrix having a large capacity can be easily controlled since the terminals for selecting unit matrices are provided. Furthermore, since the hold state is established by turning the associated transistor off, the memory circuit has an advantage that power consumption is small.

What we claim is:

1. A memory circuit comprising
  a memory cell including two complementary transistors operatively connected to form a four-layer semiconductor having an input for receiving a data signal to be stored therein,
  a control input circuit including transistor means having at least one input transistor with its collector connected to the input of said memory cell,
  first input means connected to said control input circuit including first, econd and third input terminals receiving respective logical signals,
  second input means including a fourth input terminal receiving a data signal to be stored in said memory cell, means for connecting said fourth input terminal to an emitter of said input transistor and
  said control input circuit further including control means for controlling the base current of said input transistor on the basis of a logical product of the signals applied to said first, second and third input terminals.

2. A memory circuit as claimed in claim 1, wherein said control means is constituted of at least first and second diodes, and said input transistor has its base connected through an impedance element with said first input terminal, and said first and second diodes having their anodes connected in common with said base of said input transistor and their cathodes connected to said second and third input terminals, respectively.

3. A memory circuit as claimed in claim 2, wherein the emitter-base junctions of PNP transistors with their collectors connected in common and grounded are used as said first and second diodes with their cathodes connected to said second and third input terminals.

4. A memory circuit as claimed in claim 1, wherein said transistor means is constituted of at least said input transistor and an additional transistor and said control means is constituted of at least one diode, said input transistor having its base connected with one of the emitter and the collector of said additional transistor, said additional transistor having its base connected through an impedance element with said first input terminal and its emitter or collector, which is not connected with said base of said input transistor, connected with said third input terminal, said one diode having its cathode connected to said second input terminal and its anode connected to said base of said input transistor.

5. A memory circuit as claimed in claim 4, wherein the emitter-base junctions of PNP transistors with their collectors connected in common and grounded are used as said first and second diodes with their cathodes first input terminal and the fourth and further input terminals.

6. A memory circuit as claimed in claim 12, wherein said control means is constituted of at least first and second diodes, and said input transistor has its base connected through an impedance element with said first input terminal and its emitter connected through third and fourth diodes connected in inverse parallel configuration with each other to said fourth input terminal, said first and second diodes having their cathodes connected respectively to said second and third input terminals and their anodes connected in common with said base of said input transistor.

7. A memory circuit as claimed in claim 1, wherein said transistor means comprises at least said input transistor and an additional transistor and said control means comprises at least first and second diodes, said input transistor having its base connected with one of the emitter and the collector of said additional transistor and its emitter connected to said fourth input terminal through third and fourth diodes connected in inverse parallel configuration with each other, said additional transistor having its base connected to said second input terminal through an impedance element and its emitter or collector, which is not connected with said base of said input transistor, connected with said third input terminal, and said first and second diodes having their cathodes connected to said first input terminal and a further input terminal, respectively, and their anodes connected in common to said base of said input transistor.

8. A memory circuit as claimed in claim 7, wherein the emitter-base junctions of PNP transistors with their collectors connected in common and grounded are used as said first through fourth diodes with their cathodes used as said first input teminal and further input terminal.

9. A memory cicuit as claimed in claim 4 or claim 7, wherein said additional transistor is an NPN transistor with its emitter connected with said base of said input transistor.

10. A memory circuit as claimed in claim 4 or claim 7, wherein said additional transistor is a PNP transistor with its collector connected with said base of said input transistor.

11. A memory circuit as claimed in claim 1, wherein said control means comprises at least first and second diodes, and said input transistor has its base connected through a series circuit of two impedance elements to the first input terminal and its emitter connected a further diode to said fourth input terminal of said memory circuit, and said first and second diodes have their cathode connected to said second and third input terminals and their anodes connected in common with the junction point of said impedance elements.

* * * * *

UNITED STATES PATENT AND TRADEMARK OFFICE
CERTIFICATE OF CORRECTION

PATENT NO. : 4,288,862
DATED : September 8, 1981
INVENTOR(S) : Ichiro Ohhinata et al It is certified that error appears in the above—identified patent and that said Letters Patent is hereby corrected as shown below:

Column 8, line 34 is incorrect. Should read:

--6. A memory circuit as claimed in claim 1, wherein--.

Signed and Sealed this

Nineteenth Day of January 1982

[SEAL]

*Attest:*

GERALD J. MOSSINGHOFF

*Attesting Officer*   *Commissioner of Patents and Trademarks*